(12) United States Patent
Podlesak et al.

(10) Patent No.: US 10,698,039 B2
(45) Date of Patent: Jun. 30, 2020

(54) ELECTRICAL CURRENT CONNECTOR

(71) Applicant: The Government of the United States, as represented by the Secretary of the Army, Washington, DC (US)

(72) Inventors: Thomas Podlesak, Elkton, MD (US); Michael Gonzalez, Bel Air, MD (US)

(73) Assignee: The Government of the United States, as represented by the Secretary of the Army, Washington, DC (US)

( * ) Notice: Subject to any disclaimer, the term of this patent is extended or adjusted under 35 U.S.C. 154(b) by 128 days.

(21) Appl. No.: 15/730,859

(22) Filed: Oct. 12, 2017

(65) Prior Publication Data

US 2019/0113560 A1 Apr. 18, 2019

(51) Int. Cl.
*G01R 31/50* (2020.01)
*H01R 13/193* (2006.01)
*H01R 13/703* (2006.01)
*H01R 13/66* (2006.01)
*H01R 13/641* (2006.01)

(52) U.S. Cl.
CPC ............ *G01R 31/50* (2020.01); *H01R 13/193* (2013.01); *H01R 13/7038* (2013.01); *H01R 13/641* (2013.01); *H01R 13/6683* (2013.01)

(58) Field of Classification Search
CPC ..... G01R 31/026; H02J 11/00; H01R 13/193; H01R 13/7038; H01R 13/6683
See application file for complete search history.

(56) References Cited

U.S. PATENT DOCUMENTS

| | | | |
|---|---|---|---|
| 6,599,141 B2 * | 7/2003 | Hambley | H01R 13/4532 439/137 |
| 2002/0027496 A1 * | 3/2002 | Cern | H04B 3/56 375/258 |
| 2006/0130510 A1 * | 6/2006 | Murray | B60H 1/00585 62/292 |
| 2017/0115354 A1 * | 4/2017 | Balka | G01L 27/007 |
| 2017/0149180 A1 * | 5/2017 | Siegler | H01H 89/00 |

* cited by examiner

*Primary Examiner* — Jeff W Natalini
(74) *Attorney, Agent, or Firm* — Ronald Krosky; Azza Jayaprakash

(57) ABSTRACT

Various embodiments are described that relate an electrical current connector. The electrical current connector can be configured to provide electrical current when pressure is applied to a prong set. This pressure can cause a contact to engage with a connector. This can complete a circuit that allows the electrical current to flow. The connector can be coupled to a cable that can be configured to transfer data along with the electrical current. The cable can have an inner portion that transfers the data while an outer portion that surrounds the inner portion transfers the current.

14 Claims, 10 Drawing Sheets

ELECTRICAL CURRENT CONNECTOR

GOVERNMENT INTEREST

The innovation described herein may be manufactured, used, imported, sold, and licensed by or for the Government of the United States of America without the payment of any royalty thereon or therefor.

BACKGROUND

Many modern devices run off electrical power. This power can be received directly, such as from a wall outlet, or indirectly, such as from an internal battery charged from a wall outlet or a replicable battery. It can be important for the power to be safely transferred from a supplier to the device or from one location to another.

SUMMARY

In one embodiment, a system, that is at least partially hardware, comprises a monitor component and a management component. The monitor component can be configured to monitor a connection state of an electrical connector to produce a monitor result. The management component can be configured to cause the electrical connector to be energized based, at least in part, on the monitor result. When the monitor result indicates that the connection state is such that the electrical connector is connected to an electrical apparatus, the management component can cause the electrical connector to be energized. When the monitor result indicates that the connection state is such that the electrical connector is not connected to the electrical apparatus, the management component can be configured to not cause the electrical connector to be energized.

In another embodiment, an electrical connector comprises an engagement set, a plunger physically coupled to the engagement set, an energy storage device physically coupled to the plunger, a contact physically coupled to the energy storage device, and a current receiver connector. The energy storage device can be set at a force level such that when at rest the contact does not touch the current receiver connector. When the engagement set engages with a receptor, the engagement set can experience a pressure. When the pressure meets a threshold, the pressure can cause the plunger to move the energy storage device to overcome the force level such that the contact touches the current receiver connector. When the contact touches the current source connector, the engagement set can be energized.

In yet another embodiment, a cable can comprise an inner conduit configured to transfer a data to an apparatus. The cable can also comprise an outer conduit configured to transfer an electrical current to the apparatus. The outer conduit can encompass the inner conduit.

BRIEF DESCRIPTION OF THE DRAWINGS

Incorporated herein are drawings that constitute a part of the specification and illustrate embodiments of the detailed description. The detailed description will now be described further with reference to the accompanying drawings as follows.

DETAILED DESCRIPTION

Figure 1:
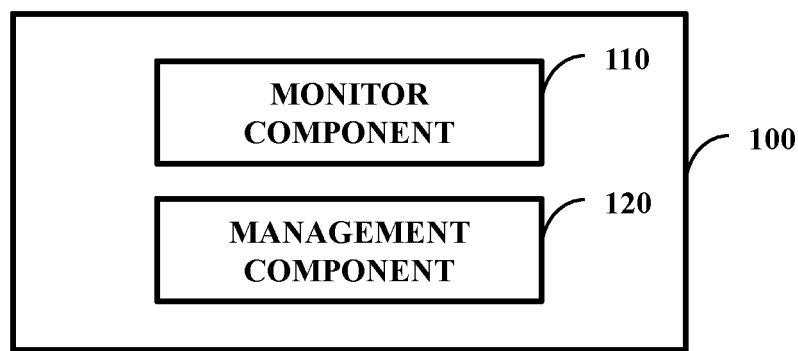
FIG. 1 illustrates one embodiment of a system comprising a monitor component and a management component.

In one embodiment, an electrical current connector can be employed. The connector can connect one electrical channel to another. In one example, the connector is for a supply with power. If a person were to inadvertently touch a prong of the connector while the prong is powered, then the person could suffer physical injury. Therefore, the connector can be unpowered until appropriate pressure is applied, such as pressure from a female receiver.

The following includes definitions of selected terms employed herein. The definitions include various examples. The examples are not intended to be limiting.

"One embodiment", "an embodiment", "one example", "an example", and so on, indicate that the embodiment(s) or example(s) can include a particular feature, structure, characteristic, property, or element, but that not every embodiment or example necessarily includes that particular feature, structure, characteristic, property or element. Furthermore, repeated use of the phrase "in one embodiment" may or may not refer to the same embodiment.

"Computer-readable medium", as used herein, refers to a medium that stores signals, instructions and/or data. Examples of a computer-readable medium include, but are not limited to, non-volatile media and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, other optical medium, a Random Access Memory (RAM), a Read-Only Memory (ROM), a memory chip or card, a memory stick, and other media from which a computer, a processor or other electronic device can read. In one embodiment, the computer-readable medium is a non-transitory computer-readable medium.

"Component", as used herein, includes but is not limited to hardware, firmware, software stored on a computer-readable medium or in execution on a machine, and/or combinations of each to perform a function(s) or an action(s), and/or to cause a function or action from another component, method, and/or system. Component may include a software controlled microprocessor, a discrete component, an analog circuit, a digital circuit, a programmed logic device, a memory device containing instructions, and so on. Where multiple components are described, it may be possible to incorporate the multiple components into one physical component or conversely, where a single component is described, it may be possible to distribute that single component between multiple components.

"Software", as used herein, includes but is not limited to, one or more executable instructions stored on a computer-readable medium that cause a computer, processor, or other electronic device to perform functions, actions and/or behave in a desired manner. The instructions may be embodied in various forms including routines, algorithms, modules, methods, threads, and/or programs including separate applications or code from dynamically linked libraries.

FIG. 1 illustrates one embodiment of a system 100 comprising a monitor component 110 and a management component 120. The monitor component 110 can be configured to monitor a connection state of an electrical connector to produce a monitor result. The management component 120 can be configured to cause the electrical connector to be energized based, at least in part, on the monitor result. When the monitor result indicates that the connection state is such that the electrical connector is connected to an electrical apparatus, the management component causes the electrical connector to be energized. When the monitor result indicates that the connection state is such that the electrical connector is not connected to the electrical apparatus, the management component does not cause the electrical connector to be energized.

Figure 2:
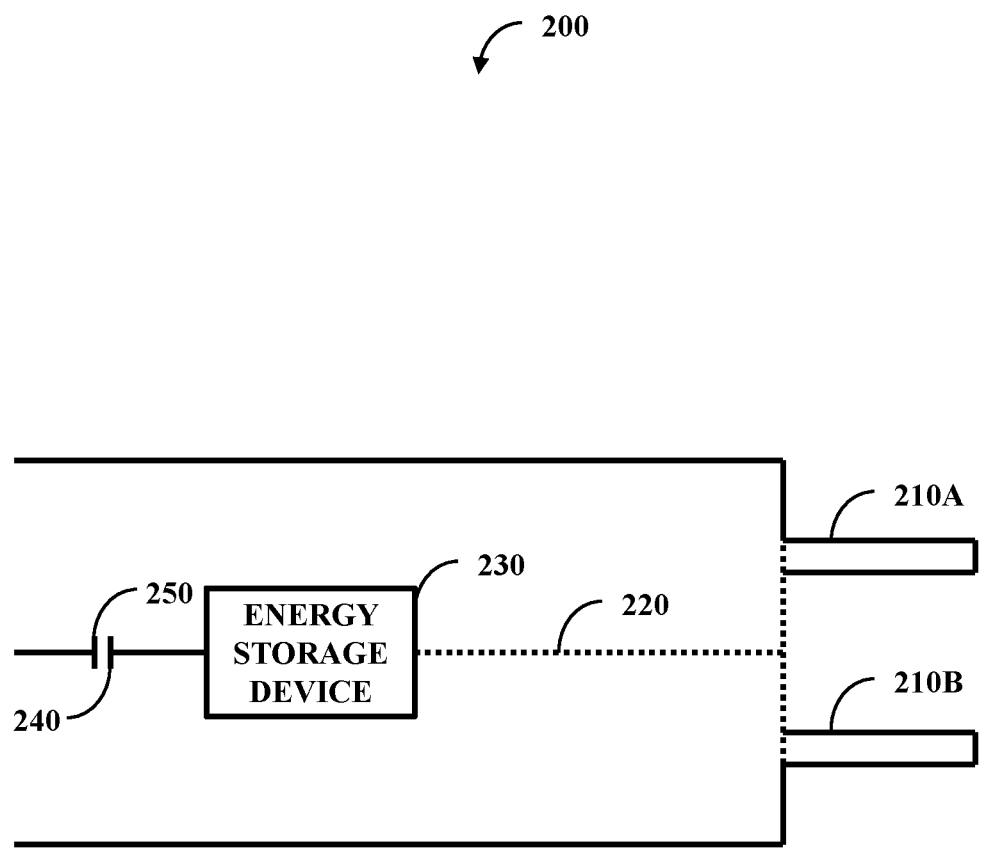
FIG. 2 illustrates one embodiment of a connector comprising an engagement set, a plunger, an energy storage device, a contact, and a current source connector.

FIG. 2 illustrates one embodiment of a connector 200 comprising an engagement set 210 (illustrated as two prongs 210A and 210B, but more or less prongs may be employed), a plunger 220, an energy storage device 230, a contact 240, and a current source connector 250. The plunger 220 connects to the engagement set 210 and the energy storage device 230. The energy storage device connects to the contact 240 that physically aligns with the current source connector 240.

The energy storage device 230 can be a compression spring. The compression spring can be set at a force level such that when at rest the contact 240 does not touch the current receiver connector 250. When the engagement set 210 engages with a receptor, the engagement set 210 experiences a pressure. When the pressure meets a threshold (e.g., equals or is greater than the threshold, is greater than the threshold), the pressure causes the plunger 220 to move the compression spring to overcome the force level such that the contact 240 touches the current receiver connector 250. When the contact 240 touches the current source connector 250, the current receiver connector is energized.

In one embodiment, the engagement set 210 are prongs external to a housing of the connector that directly experience the pressure. In one embodiment, the engagement set 210 is internal to the housing. The receptor can have a male end and the engagement set 210 can be a female end. The receptor put pressure on the female end that ultimately causes the contact 240 to touch the connector 250. With this, it can be more difficult for a person using the connector to accidentally energize the connector 200 and touch a part of the connector 200 to cause injury. When the pressure is no longer put on the engagement portion 210 (e.g., the threshold is no longer met), then the connector 200 can become deenergized.

While the engagement portion 210 is illustrated as two prongs 210A and 210B coupled to a single plunger 220, other implementations can be practiced. In one example, the prongs 210A and 210B can have their own plungers 220, own energy storage devices 230, and own contacts 240. These contacts 240 can correspond to individual current source connectors 250 such that the prongs can be individually energized. Conversely, the contacts 240 can correspond to a single current source connector 250 that causes energizing of the prongs 210A and 210B, and in turn the connector 250. The connector 200 (e.g., by way of the prongs 210A and 210B) can be configured to individually energize or have both contacts 240 engage before energizing.

In one embodiment, the engagement portion 210 is the monitor component 110 of FIG. 1. In this embodiment, the plunger 220, the energy storage device 230, and the contact 240 are the management component 120 of FIG. 1. In one embodiment, the monitor component 110 of FIG. 1 and/or the management component 120 of FIG. 1 can implement as software and control the connector 200.

In one embodiment, the current source connector 250 could function instead as a current reception connector. Above, the current source connector 250 is for when the connector 200 is part of an electrical supply. However, the connector could be part of an electrical receiver. With this, the engagement set 210, plunger 220, energy storage device 230, and contact 240 can be energized when coming into contact with an apparatus (e.g., an apparatus with a female end that receives the prongs 210A and 210B). The current reception connector 250, and in turn what connects to the current reception connector 250, can be non-energized until contacted by the contact 240 in response to the pressure.

Figure 3A:
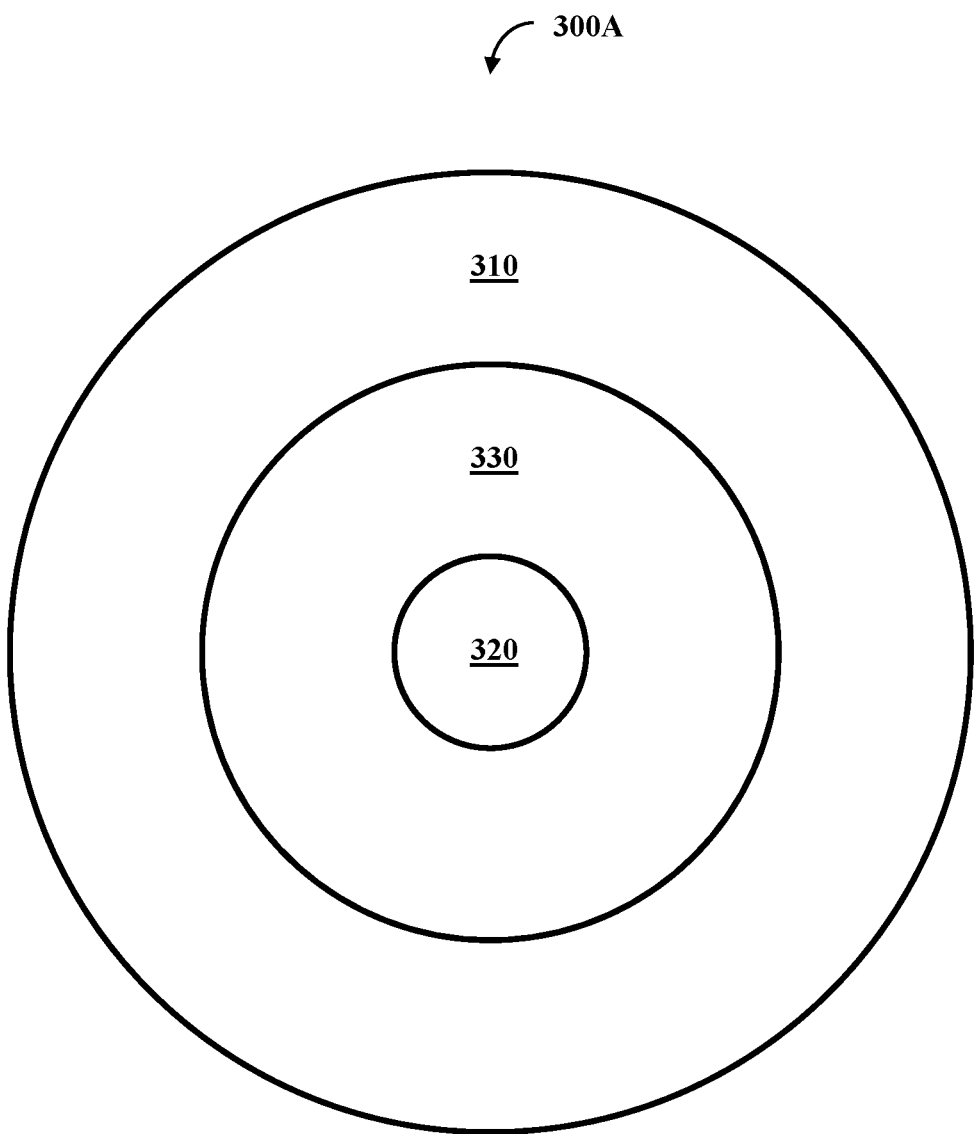
FIG. 3A illustrates one embodiment of a sliced view of a cable.
Figure 3B:
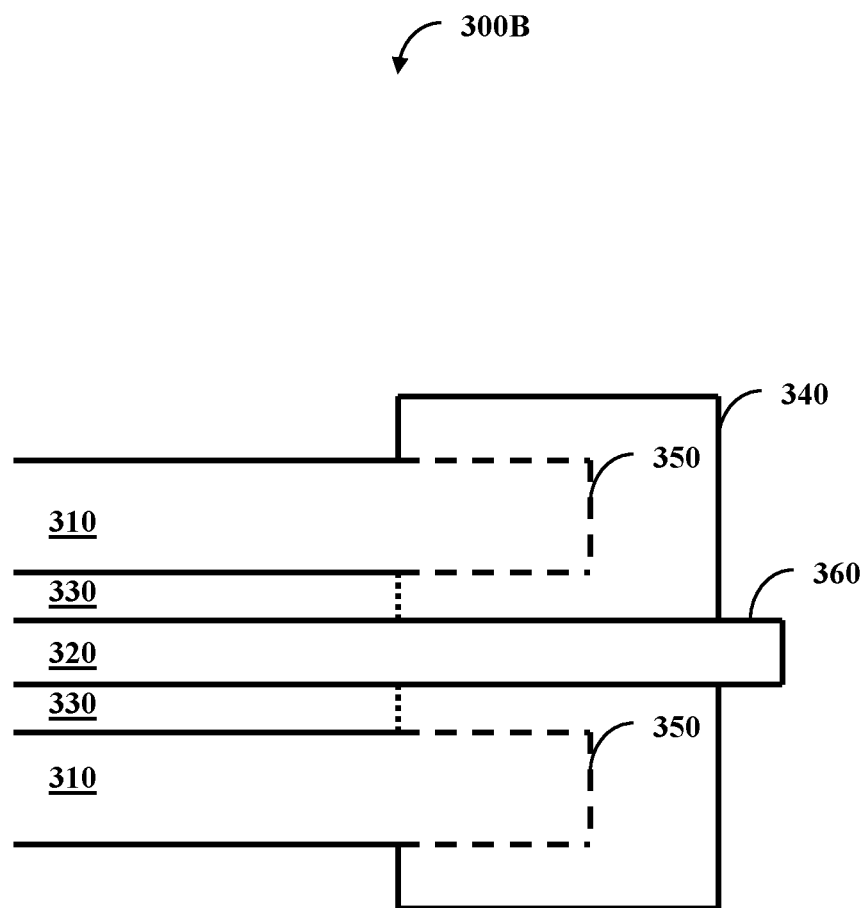
FIG. 3B illustrates one embodiment of an exposed profile view of the cable.

FIG. 3A illustrates one embodiment of a sliced view 300A of a cable 300 and FIG. 3B illustrates one embodiment of an exposed profile view 300B of the cable 300. The cable 300 can comprise an outer conduit 310 that encompasses (e.g., surrounds regarding a cross-section view) an inner conduit 320. In one embodiment, the conduits 310 and 320 are separated by a buffer 330, such as solid material or cooling liquid, to provide physical, electrical, and/or thermal isolation (and potentially protection) for the conduits 310. The outer conduit 310 can transfer electrical current to an apparatus and the inner conduit 320 can transfer data to the apparatus.

This transfer can be independent. In one example, the cable 300 connects a first apparatus to a second apparatus. The first apparatus can sent electrical current to the second apparatus by way of the outer conduit 310. The second apparatus can use this electrical current to power itself and transfer data along the inner conduit 320. Conversely, the cable 300 can have both current and data transfer from the first apparatus to the second apparatus. The current transfer and/or the data transfer can employ more than one cable (e.g., two data cables are the inner conduit 320 surrounded by one power cable as the outer conduit 310).

The cable 300 can be an alternating current (AC) power cable. AC power cables can be subject to skin effect, which cause the electrical current to flow along the outer edges of the cable 300 with no current flowing in the center of the cable 300. In one example, 60 Hertz current flowing an aluminum conductor can, in one embodiment, penetrate a depth of about 6 millimeters. Therefore, the diameter of the cable 300 can be greater than about 12 millimeters—enough to have the depth met and to fit a data cable. The data cable can be made from a more physically vulnerable material than the aluminum of the outer conduit 310, such as a fiber optic cable of one or more strands. With this, the outer conduit 310 can be a physical protector of the inner conduit 320.

Therefore, in this regard, the center part of the cable 300 has no purpose and can be eliminated to create a hollow cable 300 with an outer portion 310. The hollowed portion can be filled with a data cable that functions as the inner portion 320. The cable 300 can have termination connectors on both ends to allow transfer by way of the inner portion 320 and the outer portion 310.

While the cable 300 and the connector 200 of FIG. 2 can be practiced independently, in one embodiment the cable 300 can terminate with the connector 200. In one example, prong 210A of FIG. 2 is an electrical current prong and prong 210B of FIG. 2 is a data prong. Also, while the cable 300 is illustrated with electrical current on the outside and data on the inside, other arrangements can be practiced, including other transfer (e.g., fluid instead of data on the inner) or other usage (e.g., a flip with data on the outside).

In one embodiment, the cable can terminated in a connector 340. The connector 340 can have a female end 350 for the outer conduit 310 and a male end 360 for the inner conduit 320. This can be flipped with the outer conduit 310 having a male end and the inner conduit 320 having a female end. The conduits 310 and 320 can have same gendered ends as well (both male or both female).

Figure 4:
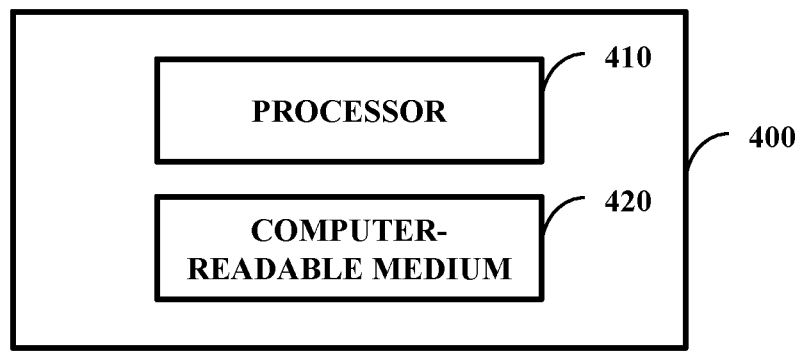
FIG. 4 illustrates one embodiment of a system comprising a processor and a computer-readable medium.

FIG. 4 illustrates one embodiment of a system 400 comprising a processor 410 and a computer-readable medium 420 (e.g., non-transitory computer-readable medium). In one embodiment, the computer-readable medium 420 and the processor 410 form at least part of an industrial controller configured to control a process of manufacture, such as laying an inner cable into an outer cable and/or machining an outer cable with a hollow center. In one embodiment, the computer-readable medium 420 is communicatively coupled to the processor 410 and stores a command set executable by the processor 410 to facilitate operation of at least one component disclosed herein (e.g., the monitor component 110 of FIG. 1). In one embodiment, at least one component disclosed herein (e.g., the management component 120 of FIG. 1) can be implemented, at least in part, by way of non-software, such as implemented as hardware by way of the system 400. In one embodiment, the computer-readable medium 420 is configured to store processor-executable instructions that when executed by the processor 410 cause the processor 410 to perform a method disclosed herein (e.g., the methods 500-900 addressed below).

Figure 5:
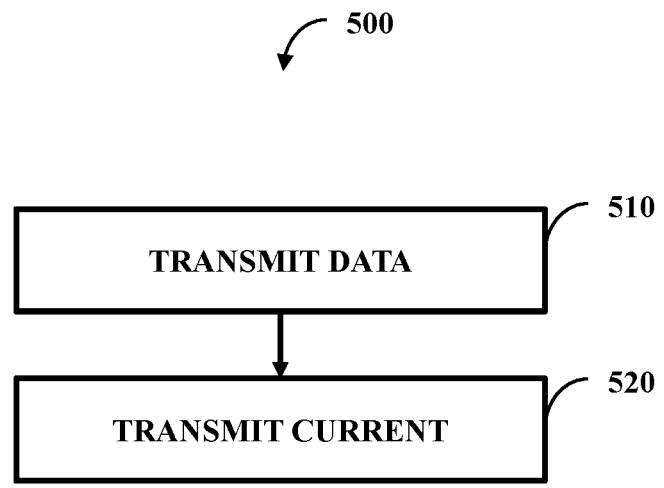
FIG. 5 illustrates one embodiment of a method comprising two actions.

FIG. 5 illustrates one embodiment of a method 500 comprising two actions 510-520. The method 500 can be performed by the cable 300 of FIGS. 3A and 3B, such as when permanently part of a device. The method 500 can include transmitting data at 510 (e.g., by way of the inner conduit 320 of FIGS. 3A and 3B). The method 500 can also include transmitting current (e.g., by way of the outer conduit 310 of FIGS. 3A and 3B).

Figure 6:
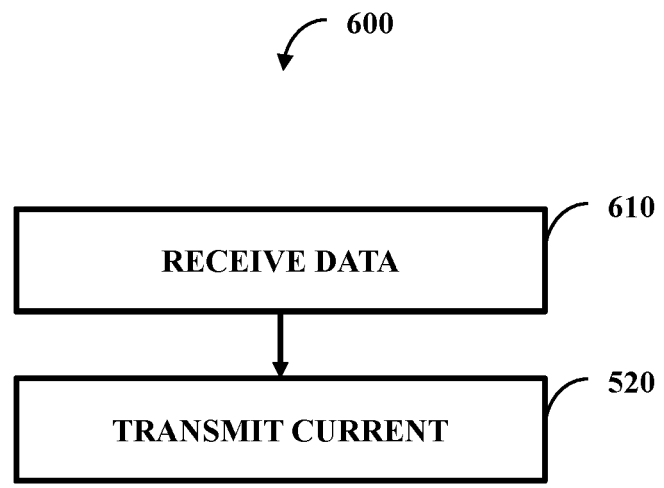
FIG. 6 illustrates one embodiment of a method comprising two actions.

FIG. 6 illustrates one embodiment of a method 600 comprising two actions 610 and 520. The method 600 can be practiced by the cable 300 of FIGS. 3A and 3B, such as when permanently part of a device. In this, the cable 300 of FIGS. 3A and 3B can be multi-directional. With this, data can be received at 610 in one direction (e.g., to the device) and current can be transmitted at 520 in another direction (e.g., from the device).

Figure 7:
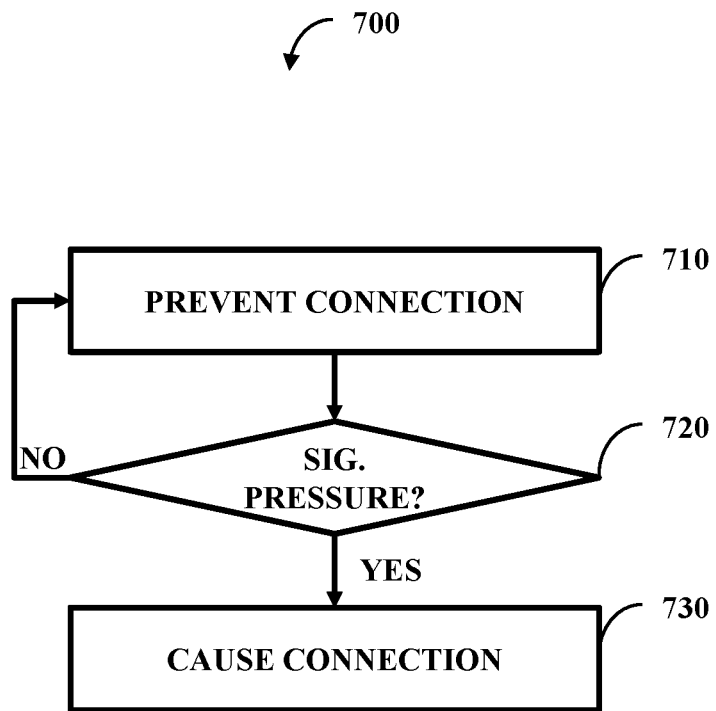
FIG. 7 illustrates one embodiment of a method comprising three actions.

FIG. 7 illustrates one embodiment of a method 700 comprising three actions 710-730. The method 700 can be performed by the system 100 of FIG. 1 and/or the connector 200 of FIG. 2. In a rest state, at 710, connection can be prevented. A pressure can be experienced and analyzed at 720. In one example, a spring can perform the analysis. There can be some pressure, but not enough to cause the contact 240 of FIG. 2 and the current source connector 250 of FIG. 2 to engage (e.g., touch). Therefore, the pressure is not significant (e.g., does not meet the threshold) and connection is still prevented. Once the pressure is significant (e.g., does meet the threshold), then the method 700 can continue to 730 where connection occurs.

Figure 8:
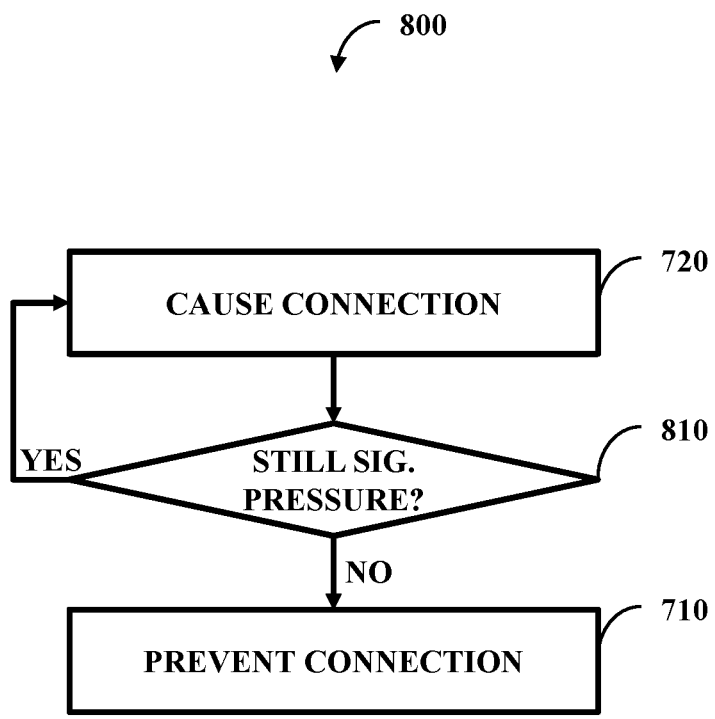
FIG. 8 illustrates one embodiment of a method comprising three actions.

FIG. 8 illustrates one embodiment of a method 800 comprising three actions 710-720 and 810. The method 800 can be the reverse of the method 700 of FIG. 7. At 720, the connection is caused and at 810 a check occurs to determine if the pressure is still significant (e.g., still meets the threshold). If so, then the connection is still caused at 720. If not, then the method 800 can prevent the connection 710 (e.g., until significant pressure is again received).

Figure 9:
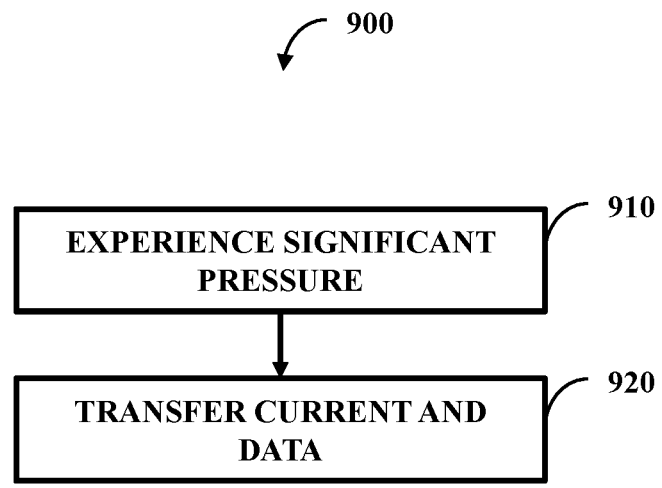
FIG. 9 illustrates one embodiment of a method comprising two actions.

FIG. 9 illustrates one embodiment of a method 900 comprising two actions 910-920. The method 900 can be practiced by the cable 300 of FIGS. 3A and 3B outfitted with the connector 200 of FIG. 2. At 910, a significant pressure can be experienced and in response, at 920, transfer of current and data can occur.

What is claimed is:

1. A system, that is at least partially hardware, comprising:
a monitor component configured to monitor a connection state of an electrical connector to an electrical receiver to produce a monitor result; and
a management component configured to cause the electrical connector to be energized based, at least in part, on the monitor result,
where the electrical connector is part of a first apparatus,
where the electrical receiver is part of a second apparatus,
where when the monitor result indicates that the connection state is such that the electrical connector is connected to the electrical receiver, the management component causes the electrical connector to be energized,
where when the monitor result indicates that the connection state is such that the electrical connector is not connected to the electrical receiver, the management component does not cause the electrical connector to be energized,
where the electrical connector connects to the first apparatus by way of a conduit
where the conduit comprises an outer conduit portion upon which an electrical current runs from the electrical receiver to the first apparatus by way of the electrical connector when the electrical connector is energized,
where the conduct comprises an inner conduit portion upon which a data is transmitted from the first apparatus to the second apparatus by way of the electrical connector and electrical receiver,
where the outer conduit encompasses the inner conduit, and
where the first apparatus employs the current to power itself and have the ability to transmit the data.

2. The system of claim 1,
where the monitor component is configured to monitor the connection state by way of physical pressure,
where when the pressure meets a threshold, the management component is configured to cause the electrical connector to be energized, and
where when the pressure no longer meets the threshold, the management component is configured to cause the electrical connector to be deenergized.

3. The system of claim 2,
where the inner conduit terminates at a female end and where the outer conduit terminates at a male end.

4. A system, that is at least partially hardware, comprising:
a monitor component configured to monitor a connection state of an electrical connector to produce a monitor result; and a management component configured to cause the electrical connector to be energized based, at least in part, on the monitor result, where when the monitor result indicates that the connection state is such that the electrical connector is connected to an electrical apparatus, the management component causes the electrical connector to be energized, where when the monitor result indicates that the connection state is such that the electrical connector is not connected to the electrical apparatus, the management component does not cause the electrical connector to be energized, where the monitor component is configured to monitor the connection state by way of physical pressure, where when the pressure meets a threshold, the management component is configured to cause the electrical connector to be energized, where when the pressure no longer meets the threshold, the management component is configured to cause the electrical connector to be deenergized, where the electrical connector comprises a first prong and a second prong, where the monitor component comprises a first monitor component configured to monitor a connection state of the first prong, where the monitor component comprises a second monitor component configured to monitor a connection state of the second prong, where the management component is configured to cause the first prong to be energized when the connection state of the first prong indicates connectivity of the first prong to the electrical apparatus and when the connection state of the second prong indicates connectivity of the second prong to the electrical apparatus, where the management component is configured to cause the second prong to be energized when the connection state of the second prong indicates connectivity of the second prong to the electrical apparatus and when the connection state of the first prong indicates connectivity of the first prong to the electrical apparatus, where the electrical connector couples to an outer conduit upon which an electrical current runs when the electrical connector is energized, where the electrical connector couples to an inner conduit upon which a data is transmitted, and where the outer conduit encompasses the inner conduit.

5. The system of claim 4, where an electrical current runs from the electrical apparatus to the electrical connector along the outer conduit concurrently while the data runs along the inner conduit from the electrical connector to the electrical apparatus.

6. The system of claim 4, where an electrical current runs from the electrical connector to the electrical apparatus along the outer conduit concurrently while the data runs along the inner conduit from the electrical apparatus to the electrical connector.

7. The system of claim 4, where a solid material buffers the outer conduit from the inner conduit to provide isolation.

8. The system of claim 4, where a liquid material buffers the outer conduit from the inner conduit to provide isolation.

9. A system, that is at least partially hardware, comprising:

a monitor component configured to monitor a connection state of an electrical connector to produce a monitor result; and a management component configured to cause the electrical connector to be energized based, at least in part, on the monitor result, where when the monitor result indicates that the connection state is such that the electrical connector is connected to an electrical apparatus, the management component causes the electrical connector to be energized, where when the monitor result indicates that the connection state is such that the electrical connector is not connected to the electrical apparatus, the management component does not cause the electrical connector to be energized, where the monitor component is configured to monitor the connection state by way of physical pressure, where when the pressure meets a threshold, the management component is configured to cause the electrical connector to be energized, and where when the pressure no longer meets the threshold, the management component is configured to cause the electrical connector to be deenergized, where the electrical connector couples to an outer conduit upon which an electrical current runs when the electrical connector is energized, where the electrical connector couples to an inner conduit upon which a data is transmitted, and where the outer conduit encompasses the inner conduit.

10. A system, that is at least partially hardware, comprising:

a monitor component configured to monitor a connection state of an electrical connector to produce a monitor result; and a management component configured to cause the electrical connector to be energized based, at least in part, on the monitor result, where when the monitor result indicates that the connection state is such that the electrical connector is connected to an electrical apparatus, the management component causes the electrical connector to be energized, where when the monitor result indicates that the connection state is such that the electrical connector is not connected to the electrical apparatus, the management component does not cause the electrical connector to be energized, where the monitor component is configured to monitor the connection state by way of physical pressure, where when the pressure meets a threshold, the management component is configured to cause the electrical connector to be energized, where when the pressure no longer meets the threshold, the management component is configured to cause the electrical connector to be deenergized, where the electrical connector comprises a first prong and a second prong, where the monitor component comprises a first monitor component configured to monitor a connection state of the first prong, where the monitor component comprises a second monitor component configured to monitor a connection state of the second prong, where the management component is configured to cause the first prong to be energized when the connection state of the first prong indicates connectivity of the first prong to the electrical apparatus and when the connection state of the second prong indicates connectivity of the second prong to the electrical apparatus, where the management component is configured to cause the second prong to be energized when the connection state of the second prong indicates connectivity of the second prong to the electrical apparatus and when the connection state of the first prong indicates connectivity of the first prong to the electrical apparatus, where the first prong is an electrical current prong that functions as a terminating end of an outer conduit and where the second prong is a data prong that functions as a terminating end of an inner conduit encompassed by the outer conduit.

11. A system, that is at least partially hardware, comprising:

a monitor component configured to monitor a connection state of an electrical connector to produce a monitor result; and a management component configured to cause the electrical connector to be energized based, at least in part, on the monitor result, where when the monitor result indicates that the connection state is such that the electrical connector is connected to an electrical apparatus, the management component causes the electrical connector to be energized, where when the monitor result indicates that the connection state is such that the electrical connector is not connected to the electrical apparatus, the management component does not cause the electrical connector to be energized, where the monitor component is configured to monitor the connection state by way of physical pressure, where when the pressure meets a threshold, the management component is configured to cause the electrical connector to be energized, where when the pressure no longer meets the threshold, the management component is configured to cause the electrical connector to be deenergized, where an electrical connector couples to an outer conduit upon which electrical current runs when the electrical connector is energized, where the electrical connector couples to an inner conduit upon which a data is transmitted, where the outer conduit encompasses the inner conduit, where the outer conduit terminates at a male end that interfaces with the electrical apparatus, and where the inner conduit terminates at female end that interface with the electrical apparatus.

12. A system, that is at least partially hardware, comprising:

a monitor component configured to monitor a connection state of an electrical connector to produce a monitor result; and a management component configured to cause the electrical connector to be energized based, at least in part, on the monitor result, where when the monitor result indicates that the connection state is such that the electrical connector is connected to an electrical apparatus, the management component causes the electrical connector to be energized, where when the monitor result indicates that the connection state is such that the electrical connector is not connected to the electrical apparatus, the management component does not cause the electrical connector to be energized, where the monitor component is configured to monitor the connection state by way of physical pressure, where when the pressure meets a threshold, the management component is configured to cause the electrical connector to be energized, where when the pressure no longer meets the threshold, the management component is configured to cause the electrical connector to be deenergized, where an electrical connector couples to an outer conduit upon which electrical current runs when the electrical apparatus is energized, where the electrical connector couples to an inner conduit upon which a data is transmitted, where the outer conduit encompasses the inner conduit, where the outer conduit terminates at a female end that interfaces with the electrical apparatus, and where the inner conduit terminates at male end that interface with the electrical apparatus.

13. A system, that is at least partially hardware, comprising:

a monitor component configured to monitor a connection state of an electrical connector to produce a monitor result; and a management component configured to cause the electrical connector to be energized based, at least in part, on the monitor result, where when the monitor result indicates that the connection state is such that the electrical connector is connected to an electrical apparatus, the management component causes the electrical connector to be energized, where when the monitor result indicates that the connection state is such that the electrical connector is not connected to the electrical apparatus, the management component does not cause the electrical connector to be energized, where the monitor component is configured to monitor the connection state by way of physical pressure, where when the pressure meets a threshold, the management component is configured to cause the electrical connector to be energized, where when the pressure no longer meets the threshold, the management component is configured to cause the electrical connector to be deenergized, where an electrical connector couples to an outer conduit upon which electrical current runs when the electrical connector is energized, where the electrical connector couples to an inner conduit upon which a data is transmitted, where the outer conduit encompasses the inner conduit, where the outer conduit terminates at a male end that interfaces with the electrical apparatus, and where the inner conduit terminates at male end that interface with the electrical apparatus.

14. A system that is at least partially hardware, comprising:

a management component configured to cause the electrical connector to be energized based, at least in part, on a first part of a monitor result and a second part of a monitor result the electrical connector comprises a first prong and a second prong:

a first monitor component configured to monitor a connection state of the first prong to an electrical apparatus to produce the first part of the monitor result; and a second monitor component configured to monitor a connection state of the second prong to the electrical apparatus to produce the second part of the monitor result, where the management component is configured to cause the first prong to be energized when the connection state of the first prong indicates connectivity of the first prong to the electrical apparatus and when the connection state of the second prong indicates non-connectivity of the second prong to the electrical apparatus,
where the management component is configured to cause the second prong to be energized when the connection state of the second prong indicates connectivity of the second prong to the electrical apparatus and when the connection state of the first prong indicates non-connectivity of the first prong to the electrical apparatus,
where the first prong is an electrical current prong and the second prong is a data prong,
where the electrical connector couples to an outer conduit upon which an electrical current runs when the electrical connector is energized,
where the electrical connector couples to an inner conduit upon which a data is transmitted,
where the outer conduit encompasses the inner conduit,
where the outer conduit terminates at the first prong,
where the inner conduit terminates at the second prong, and
where a singular plug housing retains the first prong and the second prong.

\* \* \* \* \*